United States Patent [19]

Rates

[11] Patent Number: 5,677,203

[45] Date of Patent: Oct. 14, 1997

[54] METHOD FOR PROVIDING KNOWN GOOD BARE SEMICONDUCTOR DIE

[75] Inventor: James T. Rates, Longwood, Fla.

[73] Assignee: Chip Supply, Inc., Orlando, Fla.

[21] Appl. No.: 556,877

[22] Filed: Nov. 2, 1995

Related U.S. Application Data

[63] Continuation-in-part of Ser. No. 168,079, Dec. 15, 1993, abandoned.

[51] Int. Cl.$^6$ .................... H01L 21/66; H01L 23/50
[52] U.S. Cl. ............... 437/8; 437/183; 437/9; 437/209
[58] Field of Search .................... 451/183, 206, 451/209, 8, 217, 9; 156/627.1

[56] References Cited

U.S. PATENT DOCUMENTS

| | | | |
|---|---|---|---|
| 4,189,825 | 2/1980 | Robillard et al. | 437/8 |
| 4,411,719 | 10/1983 | Lindberg | 437/8 |
| 4,801,561 | 1/1989 | Sankhagowit | 437/207 |
| 4,842,662 | 6/1989 | Jacobi | 156/633 |
| 4,859,614 | 8/1989 | Sugahara et al. | 437/8 |
| 4,937,653 | 6/1990 | Blonder et al. | 357/68 |
| 4,947,193 | 8/1990 | Deshpande | 366/140 R |
| 4,981,817 | 1/1991 | Stone, Jr. | 437/206 |
| 5,002,895 | 3/1991 | LeParquier et al. | 437/8 |
| 5,007,163 | 4/1991 | Pope et al. | 28/840 |
| 5,008,614 | 4/1991 | Shreeve et al. | 324/158 |
| 5,083,697 | 1/1992 | Difrancesco | 228/116 |
| 5,147,084 | 9/1992 | Behun et al. | 228/56.3 |
| 5,173,451 | 12/1992 | Kinsman et al. | 437/209 |
| 5,180,093 | 1/1993 | Stansbury et al. | 228/1.1 |
| 5,208,186 | 5/1993 | Mathew | 437/183 |
| 5,249,728 | 10/1993 | Lam | 437/194 |
| 5,289,631 | 3/1994 | Koopman et al. | 29/840 |
| 5,290,588 | 3/1994 | Romero et al. | 427/123 |
| 5,438,020 | 8/1995 | Grancher et al. | 437/183 |
| 5,440,239 | 8/1995 | Zappella et al. | 324/757 |
| 5,448,165 | 9/1995 | Hodge et al. | 324/158.1 |
| 5,494,856 | 2/1996 | Beaumont et al. | 437/209 |

*Primary Examiner*—John Niebling
*Assistant Examiner*—Scott Kirkpatrick
*Attorney, Agent, or Firm*—Allen, Dyer, Doppelt, Milbrath & Gilchrist, P.A.

[57] ABSTRACT

A process for providing a temporary, non-intrusive electrical connection to bond pads of a semiconductor die permitting test and burn-in of bare die. Modified tape automated bonding (TAB) techniques are used with gold bumped die bond pads for providing known good die (KGD). After test and burn-in, the temporary connection to the die is removed without the need to reform the gold bumps prior to use in a multichip module. Gold inner leads of a TAB tape are diffusion bonded to gold bumps wherein the bonding is sufficient for providing electrical connection during the testing and burn-in of the die yet sufficiently weak for removal of the leads from the die after testing and burn-in. The process provides the KGD necessary for acceptable first assembly yields and long term reliability of multichip modules (MCM). Bare die with gold bumped, sealed bond pads are provided simplifying interconnection during testing and ultimate module use.

16 Claims, 1 Drawing Sheet

METHOD FOR PROVIDING KNOWN GOOD BARE SEMICONDUCTOR DIE

CROSS REFERENCE TO RELATED APPLICATIONS

This application is a continuation-in-part application of application Ser. No. 08/168,079, now abandoned, filed Dec. 15, 1993 for Method For Providing Known Good Bare Semiconductor Die, commonly assigned with the present invention.

BACKGROUND OF INVENTION

1. Field of Invention

The invention relates to the testing and burn-in of semiconductor devices for use in complex integrated circuits. In particular, the invention relates to a modified tape automated bonding process for providing known good bare die.

2. Background Art

Unencapsulated semiconductor die have been used in electronic hybrid modules for many years. Because of the simplicity of these modules and die, along with relatively low die prices, module manufacturers were able to effectively rework non-functioning modules by replacing the defective die. Semiconductor die manufacturers typically produce die in wafer form. These wafers were typically four to five inches in diameter and contained hundreds to thousand of individual die. The manufacturers major market for these die required them to be packaged into a plastic package suitable for mounting on a printed circuit board. Because of process variations, all of the die on the wafer were not functional. The manufactures would connect an electrical tester to each die sequentially through a delicate and complicated probe head. Because the electrical limitations of this probe, all parameters of the die could not be tested. The die were tested for only a few parameters that would identify them as candidates for further screening in packaged form. As a result of this probe deficiency, the quality level of die supplied to the hybrid manufacturers resulted in only 80% to 95% useable die.

In addition, die have become much larger, significantly more complex and very expensive. The yield from probe techniques has not changed. Therefore, hybrid, now multichip module (MCM), manufacturers face mounting expense when a bad die must be replaced. In 1991, the term "Known Good Die" (KGD) was coined. Many companies began development of a technology that would allow test and burn-in of bare die comparable to that of a packaged part. The present inventive method resulted from studies and experimental test methods seeking to provide these MCM manufacturers with a known good bare die for use in their modules.

Statistics well known to high performance microprocessor multichip module manufacturers teach us that a module having ten die selected from a die diffusion lot where there is one bad die out of every one hundred die will cause one out of ten modules to fail and require rework. With a lot of ten bad die out of each one hundred, six modules out of ten will have to be reworked. If the multichip module uses twenty die and the die were selected from a lot having one bad die out of each one hundred, two modules will fail or require reworking. Dramatically, with die selected from a lot having ten bad die out of one hundred, nine out of ten modules will have to be reworked. In fact, a large portion of the final cost of multichip modules can be attributed to rework and discarded die costs. A bare die that meets the quality and reliability of a comparably packaged part is a Known Good Die (KGD). Knowing that the die will operate within certain specifications requires that each die be one hundred percent tested and burned-in, or screened, to establish a high level of quality and reliability. Burn-in is required to eliminate what is known in the art as "infant mortality" and establish reliability demanded for the die. To combat reliability and cost issues, multichip module (MCM) manufacturers must be able to rely on the KGD selected for the module and know that at least 99.9% of these die selected will not fail, either initially or in time.

U.S. Pat. No. 5,173,451 issued to Kinsman et al. on Dec. 22, 1992 discloses a technique for providing KGD wherein a semipermanent (i.e., permitting removal) electrical connection using an ultrasonic wire bonding technique that attaches lead wires to bond pads with less bonding force than that holding the bond pad to the die. Die are affixed within a die cavity of a carrier and tested. After test and burn-in, the bond between the lead wires and the bond pads are severed. The die are removed from the carriers for use in modules connected in conventional ways such as wire bonding, TAB, or flip chip bonding. The semipermanent connection between the lead wires and the bond pads permit the connection to be removed without significantly damaging the die.

Kinsman '451 teaches away from "bumping" techniques which uses raised conductive layers typically formed by photo plating for making electrical contact with the bond pad pointing to dimensional accuracy and distortion as reasons for avoiding such techniques. Kinsman '451 goes on to disclose that subsequent to the raised portion being used, it may be desirable to separate the conductive layer, and thereby disconnect the lead from the die bond pads. At which point, the raised portions have been compressed and thus unsuitable for reuse without being reformed. Further, it is stated that the bond pads used in wire bonded die are usually recessed below a passivation layer and can form a barrier to effective contact with the bond pad if the bump is too large or is out of alignment. The passivation layer is a thin film of insulator.

U.S. Pat. No. 4,842,662 issued to Jacobi on Jun. 27, 1989 discloses a TAB tape process for bonding leads directly to aluminum bonding pads of integrated circuit devices, without contacting any other part of the printed circuit device, using ultrasonic energy, pressure, time, heat and relative dimensions of the TAB tape as parameters in the process. Jacobi '662 teaches away from gold bump bonding techniques stating that such techniques have spatial and mechanical drawbacks. The gold bumps make for mating problems because they are connected to generally round or flat ribbon-like tapes resulting in the tape sliding off the top of the bump and touch parts of the integrated circuit other than the pad. Jacobi '662 reinforces the importance of having accurate lead to pad connections.

U.S. Pat. No. 4,981,817 issued to Stone on Jan. 1, 1991 discloses a TAB method for implementing dynamic chip burn-in. Semi-conductor chips are mounted on a wire pattern formed on the obverse side of an insulating tape having a plurality of openings. A second tape is applied to the reverse surface of the first tape where wires from the wiring patterns on each tape are bonded for providing voltage and signal levels to the chips simultaneously during dynamic burn-in. As disclosed, it is conventional in the art when the chips are mounted on the circuit pattern wires that a testing function is performed on each chip to give an initial indication of whether the chip is good or bad. Those which are bad are cut out and those that are good continue in the processing. Dynamic burn-in reveals any chips that are prone to early failure.

The existing process known as TAB, tap automated bonding, affixes gold bumps to die bond pads. A gold plated TAB tape frame is then fabricated for mechanically matching leads to the die bond pads of which the leads fan out to a test pad configuration compatible with test sockets. The TAB tape is then permanently diffusion bonded to the gold bumps on the die. This bond is irreversible. After screening of the die, the die is excised from the TAB tape carrier leaving short leads attached to the die. These short leads are formed and the die is assembled typically in a manner similar to a surface mount packaged part. This process is not compatible with the majority of multi-chip module and hybrid assembly companies, who prefer wire bonding methods for electrically connecting their die. Typical in the art, subsequent to burn-in and final test, the chips or die are excised or cut from their position on the tape by the user or customer. The TAB tape is cut just outside the edges of the die forming leads for outer lead bonding. Special equipment is needed to perform the outer lead bonding assembly. The die are then mounted to a substrate of the module in a flip TAB or upright TAB arrangement. It is important therefore, that a KGD be available for use with the wire bonding assembly process preferred. The die must present a suitable bond pad having very little, if any, disturbed bond pad metal and have a bond pad that is easily bonded to a lead. Further, consistent bonding reliability and a bond pad that can meet typically stringent visual inspection is needed.

There are two primary technologies in the semiconductor multichip module industry for mounting a die on a substrate of the module. One such technology, well known in the art for many years, is wire bonding. Wire bonding of similar metals is a well-known process and as a result the wire bonding process for mounting known good die on a substrate of a multichip module is desired. The second technology is tape automated bonding (TAB) which requires a different bonding machine than standard wire bonding and uses an entirely different technology than does wire bonding. In other words, a different process and a different system is required for TAB. As of this writing, most hybrid manufacturers do not have this TAB capability. There are many manufacturers with wire bonding machine capability but many manufacturers do not have TAB technology. There is a need to provide known good die to these many manufacturers having the wire or diffusion bonding capability.

Typically, die bond pads are aluminum. Gold traces are typically used on multichip module substrates as discussed in TAB. Gold bumping is often used for providing a similar metal to the TAB and module leads. Improved multi layering techniques have been developed as disclosed in U.S. Pat. No. 5,290,588 to Romero et al. wherein an aluminum bond pad is provided with Ti/W (Titanium and Tungsten) and Gold layers in preparation for gold bumping. As disclosed in U.S. Pat. No. 5,083,697 to Difrancesco, usually, the surfaces to be joined will be composed of similar metal or metal alloy. Exemplary metals known to form diffusion bonds include aluminum, platinum, titanium, tungsten, chrome, nickel, gold, silicon, iron, copper, cobalt, silver, molybdenum, lead, tin, indium, and various alloys thereof. Difrancesco '697 discloses a method for joining a similar metal surface by diffusion bonding wherein the typical temperature, pressure, and time required to achieve a desired diffusion bond may be reduced, while the electrical and mechanical properties of the bond are enhanced by the use of metallic particles. Difrancesco '697 further discloses the use of these particles for temporary bonds with those metals which are incapable of diffusion bonding.

The industry has been seeking a Known Good Die process other than TAB. The present invention improves on the TAB process and provides KGD attractive to the multi-chip module manufacturer for efficient use of his wire bonding equipment to a die that has met his stringent burn-in and test requirements.

SUMMARY OF INVENTION

A method for testing, evaluating, and providing known good bare die, comprises the steps of affixing an electrically conductive material onto the die bond pad, wherein the material forms a bump dimensioned for diffusion bonding a lead thereto, and diffusion bonding a test lead to the bump, wherein the test lead is made from an electrically conductive material capable of forming a diffusion bond with the bump material. The diffusion bonding is sufficient for providing electrical contact between the lead and the die bond pad during electrical testing and burn-in of the die, yet also sufficiently weak for permitting the removing of the lead from the bump with any damage to the bump such that subsequent wire bonding to the bump is possible without reforming the bump.

The method for providing known good bare die further comprises communicating with the integrated circuit through the test lead, testing and evaluating operation of the die for selecting a known good die, and removing the test lead from the bump for providing a known good bare die.

In the preferred embodiment of the invention, the test lead is part of a TAB (tape automated bonding) tape having an inner lead end for electrical connection to the die and an outer lead for providing electrical connection with a die test device. The test lead and bump material is substantially made of gold, both capable of diffusion bonding. Again, in the preferred embodiment, the method further comprises the steps of providing a plurality of the die formed on a semiconductor wafer prior to forming the bump, and cutting the wafer into individual die prior to the diffusion bonding step.

It is a primary object of the present invention to provide KGD wherein the die bond pads meet established standards including minimal damage to the contact surface and a surface capable of subsequent wire bonding without bond pad preparation to correct damage from testing and burn-in. It is another object of the invention to permit a vast population of the multichip module industry having wire bonding capability to bond KGD onto their multichip modules (MCM). It is a principal object of the invention to provide known good bare die and in so doing to provide a test and burn-in process that provides the known good die bare die ready for installation onto a substrate using the known wire bonding technology. It is further an object of the invention to increase the reliability of die by reducing the potential for intermetallic reaction (purple plague) that typically takes place between an aluminum bond pad and a gold wire and thus improve reliability. It is yet another object of the present invention to provide a temporary diffusion bond between two similar conductive materials for subsequent separation of the bonded materials. It is specifically an object to provide a conductive material such as a gold bump onto an aluminum bond pad for providing a contact of similar material to a lead used in the testing and burn-in process, thus permitting diffusion bonding of the materials. It is further an object to be able to remove the lead wherein damage to the bump is limited such that the bump can be used without having to reform it prior to use in its operating environment. With such objects met by the present invention, a multichip manufacturer is able to use well known wire bonding of typically gold leads to a gold bump knowing that his wire bonding method will provide good electrical and mechanical contact to a bare die known to meet KGD standards.

BRIEF DESCRIPTION OF DRAWINGS

A preferred embodiment of the invention as well as alternate embodiments are described by way of example with reference to the accompanying drawings in which:

FIG. 2 is a top view of a TAB tape section including a die temporarily attached for testing and burn-in.

DETAILED DESCRIPTION OF PREFERRED EMBODIMENT

Figure 1:
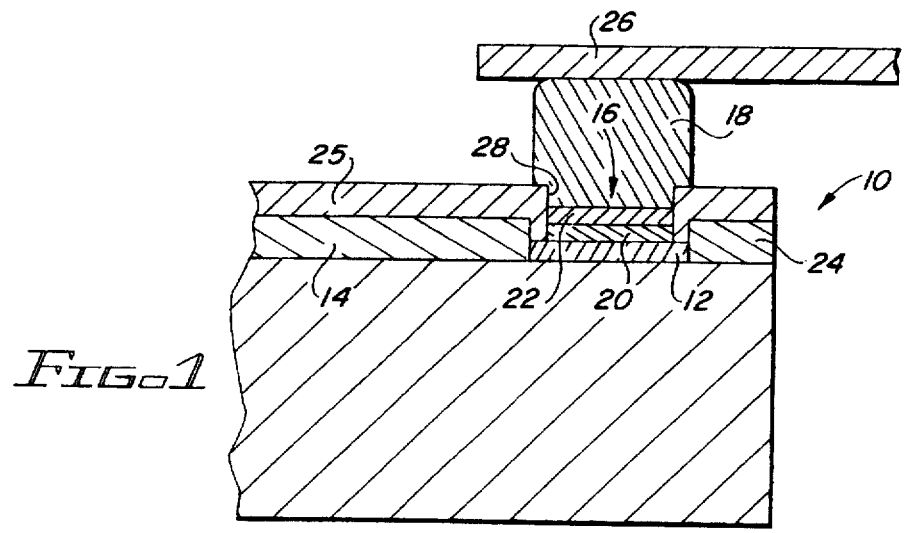
FIG. 1 is a partial cross-sectional view of a die bond pad having a field metals layer interface between the bond pad and a gold bump to which a gold lead is diffusion bonded.

The present invention is a method for providing known good bare die described herein with reference to FIG. 1 illustrating a partial cross-sectional view of a die 10 having an aluminum bond pad 12 affixed to a die surface 14. A field metals layer 16 provides an interface and is affixed between the bond pad 12 and a gold bump 18.

The field metals layer 16 prevents intermetallic reaction between the aluminum bond pad 12 and the gold bump 18. Such an intermetallic reaction reduces die reliability. Typically gold wires or gold traces are used in multichip modules employing die 10 which typically have aluminum bond pads 12. The aluminum is sealed off by the field metals layer such that no corrosion results at an otherwise gold-aluminum interface. In the preferred embodiment of the invention, a first field metals layer 20 of titanium and tungsten (Ti/W) is vacuum deposited and followed by a vacuum deposition of a second field metals layer 22 of gold.

Again with reference to FIG. 1, the die bond pads 12 are typically recessed below a passivation layer 24 and in the preferred embodiment are recessed below this first passivation layer 24 affixed to the die surface 14 and a second passivation layer 25 affixed onto the first passivation layer 24. In the preferred embodiment, a gold lead 26 is inner lead bonded (ILB) to the gold bump 18 for testing or for installation onto its final place on a multi chip module (not shown) using diffusion bonding techniques.

In general, the inventive process includes the steps of gold bumping the die 10 on a wafer, preparing a tape automated bonding (TAB) tape appropriate for the die 10 being tested, assembling the die 10 onto the TAB tape by providing a removable diffusion bond, test and burn-in of the die 10 and disassembly of the die 10 from the TAB tape for delivery of the known good die (KGD) 10 by lifting the lead 26 from the bump 18 without damage to the bump 18 for wire bonding to a module without the need to reform the bump 18.

Wafer Bumping: The process of preparing the die 10 for test and burn-in includes applying the gold bumps 18 to a plurality of the die 10 which are formed on a semiconductor wafer (not shown). In the preferred method, the entire wafer has the second passivation layer 26 added to better define bond pad windows 28 and seal any pin holes located in the original or first passivation layer 14.

The entire wafer is coated with photoresist and new bond pad windows are imaged and etched using a photomask customized to the die 10 being prepared. At this point, the field metals layer 16 is vacuum deposited onto the entire wafer surface.

As described earlier for aluminum bond pads 12 and gold bumps 18, a first field metals layer 20 of titanium and tungsten (Ti/W) is deposited followed by a gold deposition layer 22. A high temperature Ti/W-Au field metal process is employed that provides a high immunity to metal migration which if not eliminated causes gold bump adhesion problems. The field metals layer 16 in the preferred embodiment is approximately 8000 Angstroms, 5000 Angstroms of Ti/W, 3000 angstroms of Au thick. The passivation layers 24, 25 are typically an insulating layer of silicon nitride or polyamide material. The passivation layer bond pad window 28 can be achieved during wafer fabrication or as an added process.

The entire wafer is coated with a photoresist and the bump windows 28 are imaged. Gold bumps 18 are plated onto every bond pad 12 of each die 10 on the wafer. The photoresist is removed and the field metals layer 16 not under the bump 18 is etched off. The wafer bumping complete, the wafer is then sawed into individual die 10 ready now for inner lead bonding (ILB) to the TAB tape leads 26 for test and burn-in.

Figure 2:
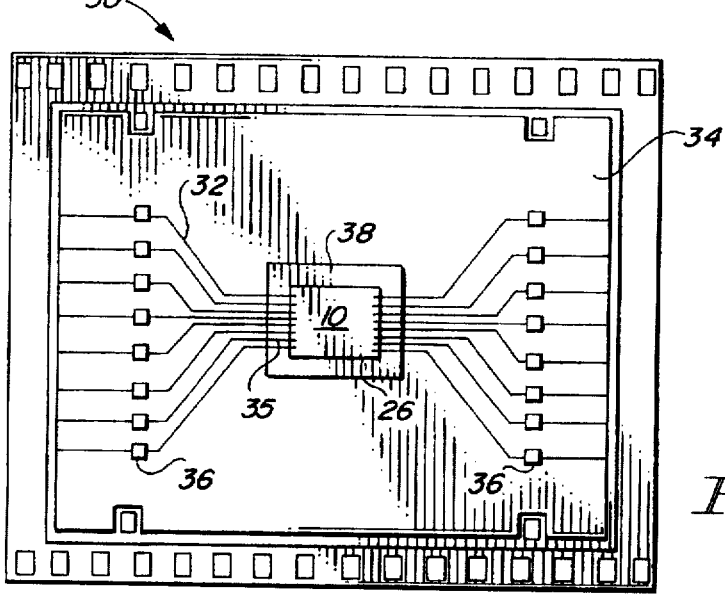

TAB tape: A TAB tape designed to meet the needs of the die 10 being tested is produced on a computer aided design system that mechanically matches the leads 26 to the bumped bond pads 12 for diffusion bonding of the leads 26 to the bumps 18. The tape is fabricated as illustrated in the TAB tape section 30 of FIG. 2. As is typical for TAB tapes, the tape section 30 comprises gold traces 32 plated onto a tape surface 34 having test socket contact pads 36 for affixing leads from test devices. The traces 32 extend over the surface 34 and over an excise window 38 for connection with the die 10 by inner lead bonding of the traces 34 with the die bond pads 12.

Assembly: In the inventive method herein described, the TAB tape traces 34 are removably bonded at the inner lead portions 35 to the die gold bumps 18. Special setup parameters described below are used to perform the inner lead bonding (ILB) using by way of example a Hughes 2900A thermosonic single point TAB bonder. The use of such a diffusion bonder is described in a February 1966 article, by Gary Silverberg, of *Microelectronic Manufacturing and Testing magazine*. By welding the lead 26 or inner leads 35 to the bumps 28 using diffusion bonding, a softening effect takes place upon the metals capable of diffusion bonding causing them to become plastic. As the bump 18 and lead 26 metals begin to flow, pressure applied brings them into intimate contact for forming the diffusion bond.

Again with reference to FIG. 2, the trace lead 26 is attached firmly enough to remain in good electrical contact through test and burn-in procedures, but must be removable with minimal damage to the bump 18 or die 11). Damage is limited to that level not requiring reforming of the bump 18 prior to use in a module. The goal of the assembly process is to yield a removal force of less than 20 grams. By way of example, the Hughes 2900A single point TAB bonder included settings of 30 for time, 30 for force, 50 for power and 280° C. for temperature.

Test and Burn-in: The die 10 is then subjected to electrical test and burn-in to verify quality and reliability meet standards set by the manufacturer. By way of example, standard electrical tests include DC, AC, functional and access times. Burn-in for 48 hours at 125° C. is typical. The TAB tape 30 prepared in the preferred embodiment is capable of testing at temperatures ranging from −55° C. to 150° C. without damage to the tape. The TAB tape parts are screened to the requirements of MIL-STD-883, Method 5004. Testing to special standards are also performed and often require a die having a 0.999 or 99.9% quality and reliability level. In other words, with a quality and reliability level yielding a die lot of 1000 units, it is expected that only one will fail.

Disassembly: The TAB tape die is removed by mechanically lifting the trace leads 26 from each bump 18. The die 10 is then visually inspected for damage. Minor deformation is typically permitted, but damage requiring that the bump 18 be reformed prior to subsequent use is not. Such a die will be discarded from the delivered lot. The die 10 passing such tests are known good die ready for wire bonding to a module for which it was designed and fabricated.

By way of comparison, in a typical TAB tape procedure, the traces are permanently attached to the gold bumps on a die using thermocompression or thermosonic forces. The TAB tape is intended as a permanent interconnect between the die and the substrate. This inner lead bond (ILB) must withstand a force of approximately 35 grams without failure. In disassembly of a tested die for the normal TAB tape technique, the trace lead 26 is excised by cutting the TAB tape trace slightly outside the edges of the die resulting in leads requiring outer lead bonding (OLB). The die is typically used in a module as a flip TAB or upright TAB with a support ring needed to support the leads extending from the pads. Special equipment is needed to perform the OLB assembly.

In summary, the aluminum bond pads 12 are sealed with the field metals layer 16 for permitting a gold bump 18 to be affixed to the bond pad 12 without concern for reduced die reliability. Typically, gold wires or gold traces are used in multichip modules. The gold wires can now be wire bonded to the gold bumps 18 without concern for the problems associated with bonding dissimilar metals. In addition, tests show that approximately 30% less force is needed to attach a gold wire to a gold bumped bond pad than conventional bonding, resulting in less stress to the die. Bond pull tests performed on the gold bumps have resulted in 100% wire breaks.

Figure 3:
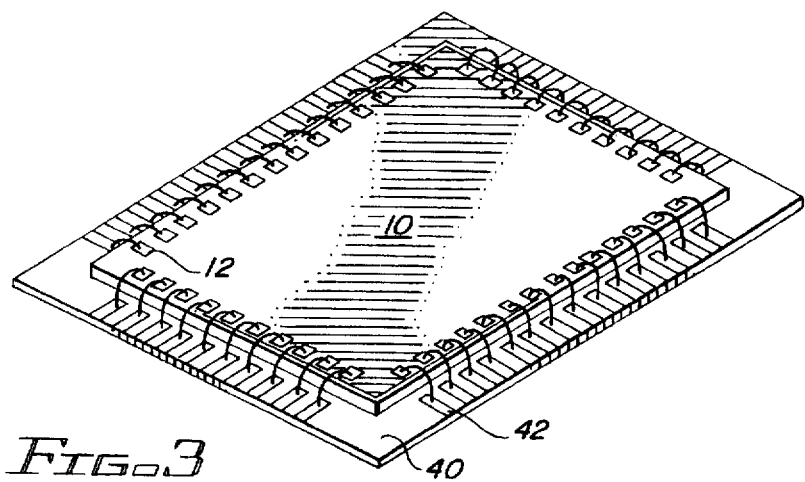
FIG. 3 is a partial perspective view of a die having a multiplicity of bond pads in a high density configuration.

With reference to FIG. 3, and by way of example to illustrate wire bonding techniques used to connect the die bond pads 12 to the substrate pads 42, large pin or pad counts are possible with the inventive methods and embodiments described herein. This method permits bond pad/lead pitch as small as 0.004 inches or approximately 100 microns. Such is not practical with typical TAB techniques. This method meets the demands of today's dense monolithic integrated circuits requiring 100% test and burn-in (screening) including temperature tested, electronic speed tested and burned-in components.

While a specific embodiment of the invention has been described in detail herein above, it is to be understood that various modifications may be made from the specific details described herein without departing from the spirit and scope of the invention as set forth in the appended claims.

Having now described the invention, the construction, the operation and use of preferred embodiments thereof, and the advantageous new and useful results obtained thereby, the new and useful constructions, and reasonable equivalents thereof obvious to those skilled in the art, are set forth in the appended claims.

What is claimed is:

1. A method for testing, evaluating, and providing known good bare die, comprising the steps of:

providing an integrated circuit die having a bond pad affixed thereto for electrical communication with the integrated circuit;

affixing an electrically conductive material onto the die bond pad, the material forming a bump dimensioned for diffusion bonding a lead thereto;

providing a test lead;

Thermosonic diffusion bonding a portion of the test lead to the bump, the test lead made from an electrically conductive material capable of forming a diffusion bond with the bump material, the diffusion bonding sufficient for providing electrical contact between the lead and the die bond pad during steps of electrically testing the die, the diffusion bonding sufficient for permitting mechanically removing the test lead bonded portion from the bump wherein damage to the bump permits subsequent wire bonding directly thereto; and mechanically removing the test lead including the bonded portion from the bump for providing a known good bare die.

2. The method as recited in claim 1, further comprising the steps of:

communicating with the integrated circuit through the test lead; and testing and evaluating operation of the die.

3. The method as recited in claim 1, wherein the test lead is formed on a TAB (tape automated bonding) tape having an inner lead end portion for electrical connection to the die and an outer lead portion for providing electrical connection with a die test device.

4. The method as recited in claim 1, wherein the test lead and bump material is substantially made of gold.

5. The method as recited in claim 1, further comprising the steps of providing a plurality of the die formed on a semiconductor wafer prior to forming the bump, and cutting the wafer into individual die prior to the diffusion bonding step.

6. A method for testing, evaluating, and providing known good die, comprising the steps of:

providing a semiconductor wafer having a plurality of integrated circuit die, each die having a plurality of bond pads affixed to a surface of each die;

plating electrically conductive bumps onto each die bond pad;

cutting the wafer into individual die;

providing a TAB (tape automated bonding) tape having conductive test leads for electrical connection to the die bond pads;

Thermosonic diffusion bonding portion of each test lead to selected bumps, the diffusion bonding sufficient for making electrical contact between the tape leads and the die bond pads during burn-in and testing of the die, the diffusion bonding providing an electrical connection sufficient for testing and measuring operational features of the die integrated circuit, the diffusion bonding further sufficient for permitting mechanical removal of the leads from the bumps for subsequent wire bonding directly thereto without reforming the bump;

electrically screening the die by operating each die at a required performance level for verifying that the die is operating to within the required performance level; and mechanically removing the test leads including each test lead bonded portion from the bumps for providing a known good bare die.

7. The method as recited in claim 6, wherein the bond pads are within first windows formed in a first passivation layer affixed to the die surface, the method further comprising the steps of:

applying a second passivation layer onto the die surface prior to forming the bump for sealing pin holes within the first passivation layer;

coating the entire wafer with a photoresist layer;

imaging second bond pad windows onto the die for communicating with the first bond pad windows; and etching the second bond pad windows using a photo masking process, the etching exposing the die bond pads for the bump forming onto the bond pad.

8. The method as recited in claim 6, further comprising the step of affixing a field metals layer onto the bond pads prior to the bump forming step for providing an interface between the bond pads and the bumps.

9. The method as recited in claim 6, wherein the die have aluminum bond pads, the plating step further comprising the steps of:

depositing a Ti/W (titanium and tungsten) layer onto each bond pad; and depositing a gold layer onto the Ti/W deposition layer for enhancing electrical connection between the aluminum bond pad and a gold bump, wherein the bump plating bump step comprises electrically platting gold bumps sufficient for removably bonding to gold traces of a TAB tape.

10. A method for testing, evaluating, and providing known good bare die, the method comprising the steps of:

providing a wafer having a plurality of semiconductor die affixed to a surface of the wafer, each die having a plurality of bond pads on a surface of the die;

plating conductive bumps onto each bond pad, the plating covering the pad for providing electrical contact with the pad, the bumps of a material capable of forming a diffusion bond with test leads;

cutting the wafer into individual die for diffusion bonding test leads to the bumps;

providing a TAB tape having test leads adapted for electrical connection to a selected die bond pad;

Thermosonic diffusion bonding a portion of each selected test lead to corresponding bumps, the diffusion bonding sufficient to insure electrical connection is maintained between the test leads and the bumps during burn-in and testing, and further permitting the tape leads to be released from the bumps without effective damage to the bumps;

attaching test devices to the leads;

electrically testing and operating the die for identifying a known good die; and mechanically removing the test leads including the bonded portion from the bumps by lifting each lead from each bump for providing the known good bare die.

11. The method as recited in claim 10, wherein the diffusion bonding step comprises the step of applying thermosonic energy using a single point TAB bonder and applying force, power and bonding time parameters sufficient for creating a diffusion bond sufficient for maintaining the electrical contact during the test and burn-in steps yet below the parameters for providing a permanent diffusion bond.

12. The method as recited in claim 11, wherein the inner lead bonding resulted in a deformation less than required for reforming of the bump prior to subsequent wire bonding use in a multichip module.

13. The method as recited in claim 10, wherein the bonding step comprises bonding the lead to the bump for maintaining an original bump shape.

14. A method for providing known good die, comprising the steps of:

providing a semiconductor wafer having a plurality of integrated circuit die affixed to a surface of the wafer, each die having a plurality of aluminum bond pads affixed to a surface of the die;

plating gold bumps onto each die bond pad;

cutting the wafer into individual die for bonding of the die to gold test leads;

providing a TAB tape having a gold test lead adapted for connecting the test lead to a die bond pad bump, the test lead providing electrical contact with a die testing device;

Thermosonic diffusion bonding a portion of the test lead to the gold bump for making electrical contact therewith during burn-in and testing of the die, the diffusion bonding of the test lead portion sufficient for permitting removal of the test lead portion from the bump without deformation of the bump during lifting of the lead from the bump for removal of the die from the TAB tape;

affixing a test device to the lead;

testing the die for providing a known good bare die;

mechanically removing the test lead including the bonded portion from the gold bump for removing the die from the TAB tape; and providing a known good bare die useable without the need for reform the gold bump for wire bonding to a circuit module.

15. The method as recited in claim 14, further comprising the step of affixing a field metals layer onto the aluminum bond pads for providing an interface between the bond pads and the gold bumps thus improving reliability of electrical connection during burn-in, testing, and operation in a multichip module.

16. The method as recited in claim 15, wherein the field metals layer has a thickness of approximately 8000 Angstroms.

* * * * *